United States Patent
Baek

(10) Patent No.: US 9,076,538 B2
(45) Date of Patent: Jul. 7, 2015

(54) FUSE INFORMATION STORAGE CIRCUIT OF SEMICONDUCTOR APPARATUS

(71) Applicant: SK hynix Inc., Incheon-si Gyeonggi-do (KR)

(72) Inventor: Chang Ki Baek, Incheon-si Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/100,168

(22) Filed: Dec. 9, 2013

(65) Prior Publication Data

US 2015/0062997 A1 Mar. 5, 2015

(30) Foreign Application Priority Data

Aug. 30, 2013 (KR) .................. 10-2013-0103772

(51) Int. Cl.
*G11C 17/00* (2006.01)
*G11C 17/16* (2006.01)
*G11C 29/44* (2006.01)

(52) U.S. Cl.
CPC ............ *G11C 17/16* (2013.01); *G11C 29/4401* (2013.01); *G11C 2029/4402* (2013.01)

(58) Field of Classification Search
CPC .................. G11C 29/785; G11C 29/44; G11C 2029/4402; G11C 17/16; G11C 29/027; G11C 2229/763; G11C 29/787
USPC .................. 365/96, 225.7, 201, 200
See application file for complete search history.

(56) References Cited

U.S. PATENT DOCUMENTS

| 6,603,689 B2 * | 8/2003 | Kato et al. ................. 365/200 |
| 6,639,863 B2 * | 10/2003 | Imamura et al. ........... 365/225.7 |
| 7,254,070 B2 * | 8/2007 | Kuroki ......................... 365/200 |

FOREIGN PATENT DOCUMENTS

| KR | 1020040069824 A | 8/2004 |
| KR | 100729368 B1 | 6/2007 |

* cited by examiner

*Primary Examiner* — David Lam
(74) *Attorney, Agent, or Firm* — William Park & Associates Ltd.

(57) ABSTRACT

A test mode decoder configured to decode a test mode signal inputted a plurality of times and to generate preliminary fuse information, a count latch configured to count the preliminary fuse information in response to a count clock signal and to generate fuse information, and a fuse array block configured to store the fuse information can be included.

17 Claims, 4 Drawing Sheets

FUSE INFORMATION STORAGE CIRCUIT OF SEMICONDUCTOR APPARATUS

CROSS-REFERENCES TO RELATED APPLICATION

The present application claims priority under 35 U.S.C. §119(a) to Korean application number 10-2013-0103772, filed on Aug. 30, 2013, in the Korean Intellectual Property Office, which is incorporated herein by reference in its entirety.

BACKGROUND

1. Technical Field

Various embodiments relate to a semiconductor apparatus, and more particularly, to a fuse information storage circuit of a semiconductor apparatus.

2. Related Art

A semiconductor apparatus can include a fuse array for storing test-related setup information, repair address information, and the like.

Therefore, a fuse information storage circuit for storing corresponding information in a fuse array may be used.

SUMMARY

A fuse information storage circuit of a semiconductor apparatus capable of storing fuse information through a simplified procedure is described herein.

In an embodiment, a fuse information storage circuit of a semiconductor apparatus can include: a test mode decoder configured to decode a test mode signal inputted a plurality of times, and to generate preliminary fuse information; a count latch configured to count the preliminary fuse information in response to a count clock signal, and to generate fuse information; and a fuse array block configured to store the fuse information.

In an embodiment, a fuse information storage circuit of a semiconductor apparatus can include: a first fuse information storage path configured to store, as fuse information, information provided through a normal data path of the semiconductor apparatus; and a second fuse information storage path configured to input a test mode signal a plurality of times through a dedicated signal path, and to store the fuse information.

In still another embodiment still another embodiment, a fuse information storage circuit of a semiconductor apparatus may be configured to use one of a plurality of fuse information storage paths to store fuse information, where at least one of the plurality of fuse information storage paths is configured to store the fuse information if an error occurs when using an other of the plurality of fuse information storage paths, where the at least one of the plurality of fuse information storage paths is configured to receive a test mode signal a plurality of times through a dedicated signal path, to store the fuse information.

In an embodiment of the present invention, a mode register configured to provide the test mode signal can be additionally included.

In an embodiment of the present invention, the count latch can include a plurality of unit count latches which are configured to count each signal bit of the preliminary fuse information in response to the count clock signal, and to generate predetermined portions of the fuse information, respectively.

In an embodiment, the normal data path can include a data line between at least one memory block and a data input/output pin array of the semiconductor apparatus.

In an embodiment of the present invention, the fuse information can be stored in a fuse array block, and the first fuse information storage path and the second fuse information storage path can be configured to share the fuse array block.

BRIEF DESCRIPTION OF THE DRAWINGS

Features, aspects, and embodiments are described in conjunction with the attached drawings, in which.

DETAILED DESCRIPTION

Hereinafter, a fuse information storage circuit of a semiconductor apparatus according to the present disclosure will be described below with reference to the accompanying drawings through example embodiments.

Figure 1:
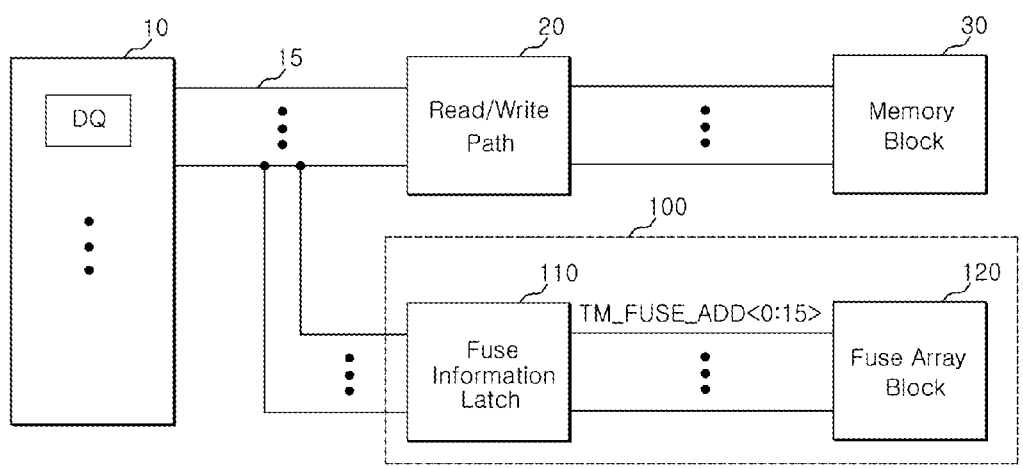
FIG. 1 is a block diagram illustrating a configuration of a fuse information storage circuit of a semiconductor apparatus according to one embodiment of the present invention.

As illustrated in FIG. 1, a fuse information storage circuit 100 of a semiconductor apparatus according to one embodiment can include a fuse information latch 110 and a fuse array block 120.

The fuse information latch 110 can be configured to latch information, e.g. address information, as fuse information TM_FUSE_ADD<0:15>. The address information may be provided through a data line 15 that is electrically coupled to a data input/output pin array 10.

The data input/output pin array 10 may also be electrically coupled through the data line to a read/write path 20 for data read/write operations.

The data input/output pin array 10 can include a plurality of input/output pins DQs.

The read/write path 20 is electrically coupled to a memory block 30.

A data read operation from the memory block 30 to the data input/output pin array 10 and a data write operation from the data input/output pin array 10 to the memory block 30 can be performed through the read/write path 20.

The fuse information latch 110 according to one embodiment can be configured to latch information which is provided through the data line 15 on a normal data read/write operation. The fuse information latch 110 may latch the information provided during a normal data read/write as fuse information TM_FUSE_ADD<0:15>.

The fuse array block 120 can include a fuse array which may comprise electronic fuses, laser fuses, or the like.

The fuse array block 120 can be configured to store fuse information TM_FUSE_ADD<0:15> in the fuse array. The fuse information TM_FUSE_ADD<0:15> may be provided from the fuse information latch 110.

The fuse information storage of the fuse array block 120 can be achieved through an external control, e.g. a high voltage application or a fuse cutting process using laser.

Figure 2:
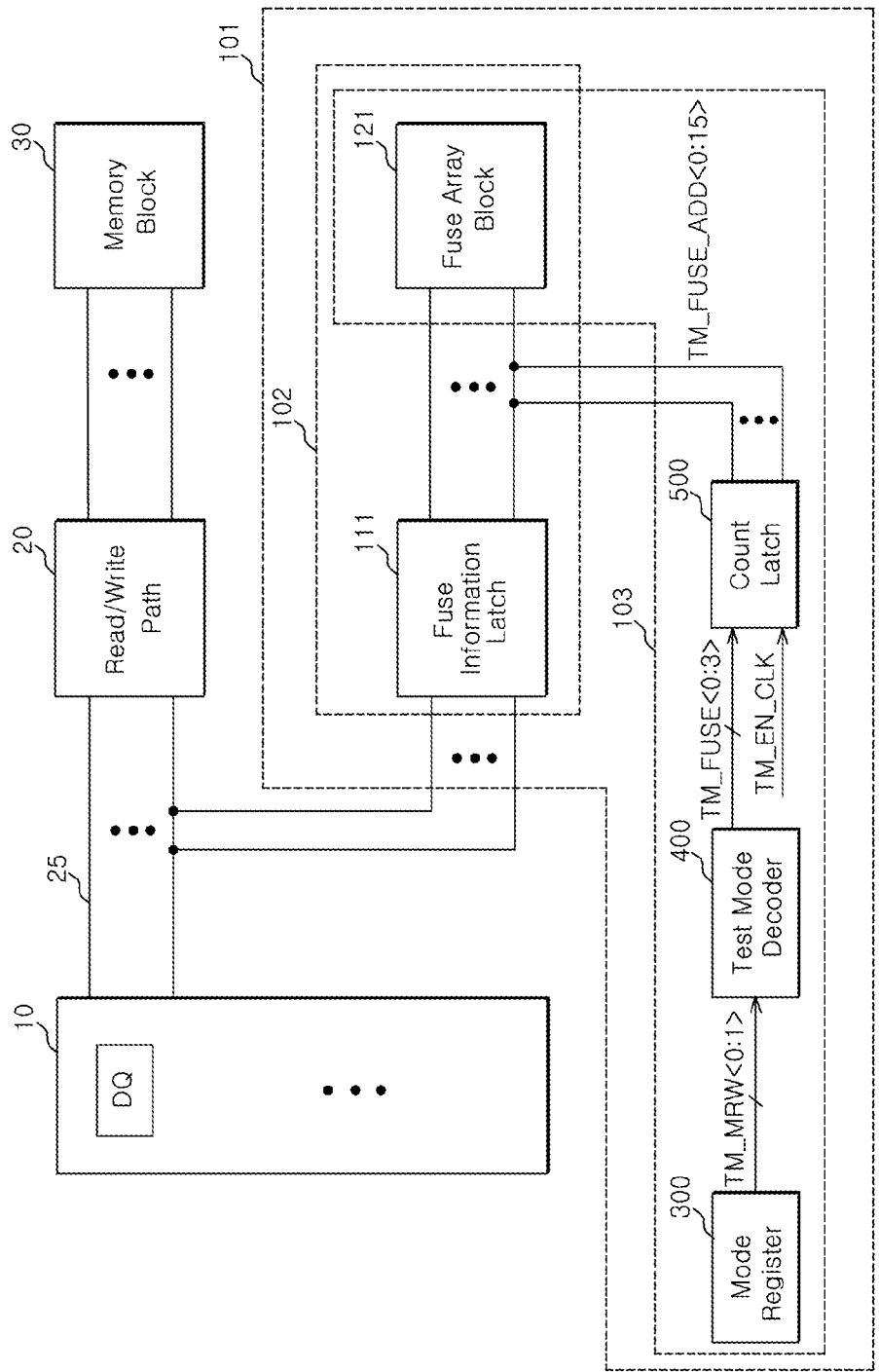
FIG. 2 is a block diagram illustrating a configuration of a fuse information storage circuit of a semiconductor apparatus according to another embodiment of the present invention.

As illustrated in FIG. 2, a fuse information storage circuit 101 of a semiconductor apparatus according to another embodiment can include a first fuse information storage path 102 and a second fuse information storage path 103.

The first fuse information storage path 102 can be configured to store fuse information provided through a normal data path.

The first fuse information storage path 102 can include a fuse information latch 111 and a fuse array block 121.

The fuse information latch 111 can be configured to latch information, e.g. address information. The address information may be provided through a data line 25 electrically coupled to a data input/output pin array 10. The fuse information latch 111 may latch the address information as fuse information TM_FUSE_ADD<0:15>.

The data line 25 electrically may electrically couple the data input/output pin array 10 with a read/write path 20. The data input/output pin array 10 and the read/write path 20 may be used to perform data read/write operations. The normal data path may include the data line, which may also be coupled with the memory block 30. Thus, the normal data path may include the data line which may form a path between the memory block 30 and the data input/output pin array.

The data input/output pin array 10 can include a plurality of input/output pins DQs.

The read/write path 20 is electrically coupled to a memory block 30.

A data read operation from the memory block 30 to the data input/output pin array 10 and a data write operation from the data input/output pin array 10 to the memory block 30 can be performed through the read/write path 20.

The fuse information latch 111 according to an embodiment can be configured to latch information. The information may be provided through the data line on a normal data read/write operation. The fuse information latch 111 may latch the information as fuse information TM_FUSE_ADD<0:15>.

The fuse array block 121 can include a fuse array which comprises electronic fuses, laser fuses, or the like.

The fuse array block 121 can be configured to store fuse information TM_FUSE_ADD<0:15> in the fuse array. The fuse information TM_FUSE_ADD<0:15> may be provided from the fuse information latch 111.

The fuse information storage of the fuse array block 121 can be achieved through an external control, e.g. a high voltage application or a fuse cutting process using laser.

The second fuse information storage path 103 can be configured to input a test mode signal a plurality of times through a dedicated signal path. The second fuse information storage path 103 may also be configured to store fuse information.

The second fuse information storage path 103 can include a mode register 300, a test mode decoder 400, a count latch 500, and a fuse array block 121.

The fuse array block 121 can be shared by the first fuse information storage path 102 and the second fuse information storage path 103.

The mode register 300 can be configured to provide a test mode signal TM_MRW<0:1>.

The mode register 300 can be configured to provide a test mode signal TM_MRW<0:1> a plurality of times, e.g. four times to the test mode decoder 400.

In this case, the test mode signal TM_MRW<0:1> can comprise a signal related to a test write mode.

The test mode decoder 400 can be configured to decode each of test mode signals TM_MRW<0:1> and to generate preliminary fuse information TM_FUSE<0:3>.

The count latch 500 can be configured to count the preliminary fuse information TM_FUSE<0:3> in response to a count clock signal TM_EN_CLK. The preliminary fuse information TM_FUSE<0:3> may be inputted into the count latch 500 at specific time intervals. The count latch 500 may also be configured to generate fuse information TM_FUSE_ADD<0:15>.

The fuse information TM_FUSE_ADD<0:15> is stored in the fuse array block 121.

The fuse information storage circuit 101 of a semiconductor apparatus can selectively use the first fuse information storage path 102 or the second fuse information storage path 103.

If an error occurs in a fuse information storage procedure when the first fuse information storage path 102 is being used, the fuse information storage can be performed using the second fuse information storage path 103.

A fuse information storage can be performed independently using only the second fuse information storage path 103. Thus, the fuse information storage circuit 101 may include a plurality of fuse information storage paths. The plurality of fuse information storage paths may comprise the first fuse information storage path 102 and the second fuse information storage path 103.

Figure 3:
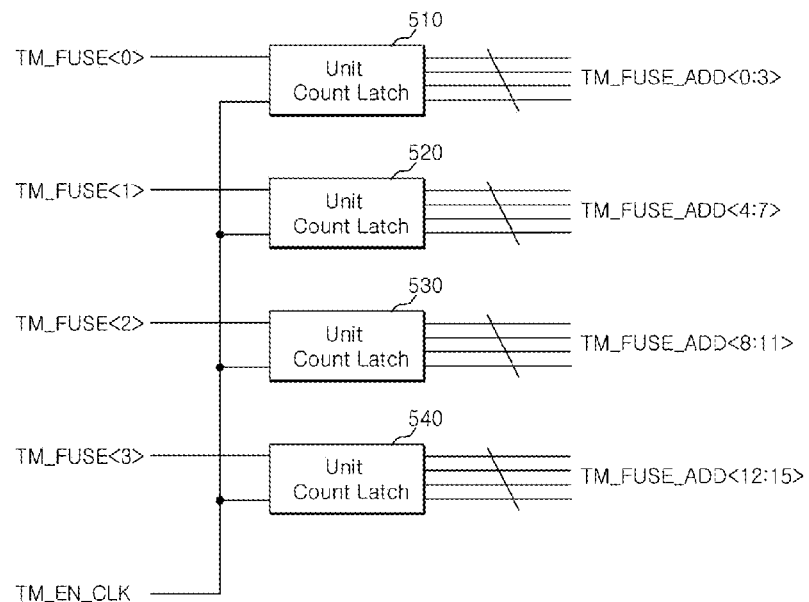
FIG. 3 is a block diagram illustrating a detailed configuration of a count latch capable of being implemented in the circuit of FIG. 2 according to one embodiment.

As illustrated in FIG. 3, the count latch 500 can include a plurality of unit count latches 510-540. The unit count latches 510-540 may be configured to count each signal bit of preliminary fuse information TM_FUSE<0:3> in response to a count clock signal TM_EN_CLK. Each of the unit count latches 510-540 may also be configured to respectively generate predetermined portions of the fuse information TM_FUSE_ADD<0:15>.

The unit count latch 510 can be configured to count the signal bit TM_FUSE<0> of the preliminary fuse information TM_FUSE<0:3> in response to the count clock signal TM_EN_CLK. The unit count latch 510 may also be configured to generate a portion TM_FUSE_ADD<0:3> of the fuse information TM_FUSE_ADD<0:15>.

The unit count latch 520 can be configured to count the signal bit TM_FUSE<1> of the preliminary fuse information TM_FUSE<0:3> in response to the count clock signal TM_EN_CLK. The unit count latch 520 may also be configured to generate a portion TM_FUSE_ADD<4:7> of the fuse information TM_FUSE_ADD<0:15>.

The unit count latch 530 can be configured to count the signal bit TM_FUSE<2> of the preliminary fuse information TM_FUSE<0:3> in response to the count clock signal TM_EN_CLK. The unit count latch 530 may also be configured to generate a portion TM_FUSE_ADD<8:11> of the fuse information TM_FUSE_ADD<0:15>.

The unit count latch 540 can be configured to count the signal bit TM_FUSE<3> of the preliminary fuse information TM_FUSE<0:3> in response to the count clock signal TM_EN_CLK. The unit count latch 540 may also be configured to generate a portion TM_FUSE_ADD<12:15> of the fuse information TM_FUSE_ADD<0:15>.

The plurality of unit count latches 510-540 can be configured and operate in a substantially similar or identical manner.

Figure 4:
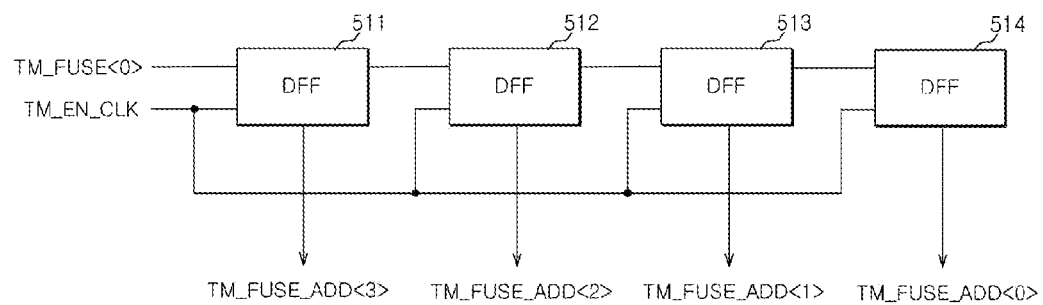
FIG. 4 is a block diagram illustrating a detailed configuration of a unit count latch capable of being implemented in the circuit of FIG. 3 according to one embodiment.

Because the unit count latches 510-540 may be configured and operate in a substantially similar or identical manner, a description of one unit count latch, for example unit count latch 510, is given. The description of unit count latch 510, however, may equally apply to the other unit count latches 520-540. As illustrated in FIG. 4, the unit count latch 510 can include a plurality of flip-flops (DFFs) 511-514 which are configured to sequentially shift the signal bit TM_FUSE<0> of the preliminary fuse information TM_FUSE<0:3> in response to the count clock signal TM_EN_CLK. The flip-flops (DFFs) 511-514 may also be configured to generate a portion TM_FUSE_ADD<0:3> of the fuse information TM_FUSE_ADD<0:15>.

Figure 5:
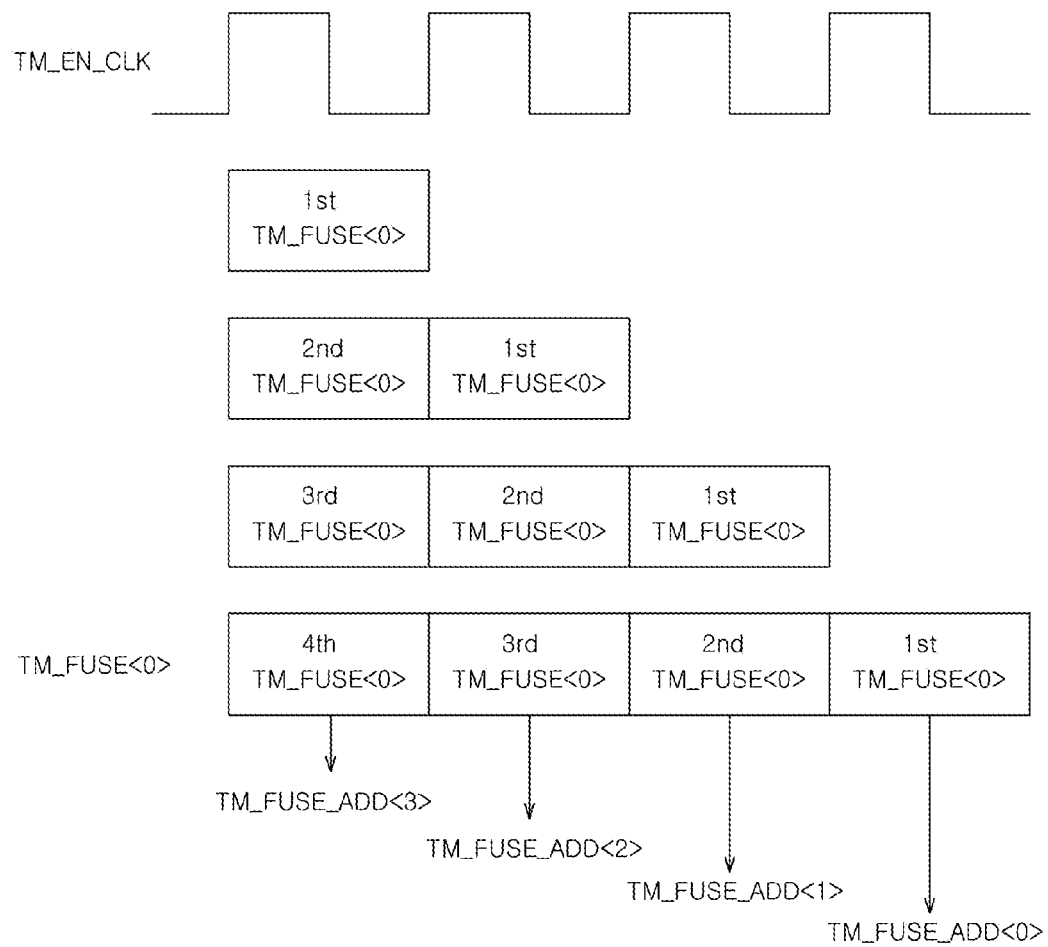
FIG. 5 is a timing diagram illustrating an operation of the unit count latch illustrated in FIG. 4 according to one embodiment.

Turning now to FIG. 5. FIG. 5 illustrates a timing diagram of one example of a test mode signal TM_MRW<0:1> being provided four times in sequence from the mode register 300 to the test mode decoder 400.

The test mode decoder 400 sequentially decodes the test mode signal TM_MRW<0:1>, which is provided four times in sequence, and generates preliminary fuse information TM_FUSE<0:3>.

When the test mode decoder receives four test mode signals TM_MRW<0:1> in sequence, the preliminary fuse information TM_FUSE<0:3> generated by sequentially decoding the test mode signal TM_MRW<0:1> four times may be referred to as a first TM_FUSE<0:3>, a second TM_FUSE<0:3>, a third TM_FUSE<0:3>, and a fourth TM_FUSE<0:3>.

The unit count latch 510 latches the signal bit "first TM_FUSE<0>" of the first TM_FUSE<0:3> in response to the count clock signal TM_EN_CLK. The signal bit "first TM_FUSE<0>" may be generated by decoding a first test mode signal TM_MRW<0:1>.

The unit count latch 510 then latches the signal bit "second TM_FUSE<0>" of the second TM_FUSE<0:3> in response to the count clock signal TM_EN_CLK and unit count latch 510 shifts the signal bit "first TM_FUSE<0>". The signal bit "second TM_FUSE<0>" may be generated by decoding the second test mode signal TM_MRW<0:1>.

As the test mode signal TM_MRW<0:1> is inputted all four times in the aforementioned manner, the unit count latch 510 generates a portion TM_FUSE_ADD<0:3> of fuse information TM_FUSE_ADD<0:15>.

The other unit count latches 520-540 operate in a substantially similar or same manner as the unit count latch 510, so fuse information TM_FUSE_ADD<0:15> is generated.

The present technology can simplify the fuse information storage procedure, and can also improve the reliability of recorded fuse information.

While certain embodiments have been described above, it will be understood to those skilled in the art that the embodiments described are by way of example only. Accordingly, the circuit described herein should not be limited based on the described embodiments. Rather, the circuit described herein should only be limited in light of the claims that follow when taken in conjunction with the above description and accompanying drawings.

What is claimed is:

1. A fuse information storage circuit of a semiconductor apparatus, comprising:
   a test mode decoder configured to decode a test mode signal inputted a plurality of times, and to generate preliminary fuse information;
   a count latch configured to count the preliminary fuse information in response to a count clock signal, and to generate fuse information; and
   a fuse array block configured to store the fuse information.

2. The fuse information storage circuit according to claim 1, further comprising a mode register which is configured to provide the test mode signal.

3. The fuse information storage circuit according to claim 1, wherein the test mode signal comprises a signal related to a test write mode.

4. The fuse information storage circuit according to claim 1, wherein the count latch comprises a plurality of unit count latches which are configured to count each signal bit of the preliminary fuse information in response to the count clock signal, and to generate predetermined portions of the fuse information, respectively.

5. The fuse information storage circuit according to claim 4, wherein the unit count latch comprises a plurality of flip-flops which are configured to shift signal bits of the preliminary fuse information in sequence in response to the count clock signal, and to generate a predetermined portion of the fuse information.

6. A fuse information storage circuit of a semiconductor apparatus, comprising:
   a fuse array block;
   a first fuse information storage path configured to store information provided through a normal data path of the semiconductor apparatus to the fuse array block as a fuse information; and
   a second fuse information storage path configured to store the fuse information to the fuse array block by inputting a test mode signal a plurality of times through a dedicated signal path.

7. The fuse information storage circuit according to claim 6, wherein the normal data path comprises a data line between at least one memory block and a data input/output pin array of the semiconductor apparatus.

8. The fuse information storage circuit according to claim 6, wherein the second fuse information storage path comprises:
   a test mode decoder configured to decode a test mode signal inputted a plurality of times, and to generate preliminary fuse information; and
   a count latch configured to count the preliminary fuse information in response to a count clock signal, and to generate the fuse information.

9. The fuse information storage circuit according to claim 8, further comprising a mode register which is configured to provide the test mode signal.

10. The fuse information storage circuit according to claim 8, wherein the count latch comprises a plurality of unit count latches which are configured to count each signal bit of the preliminary fuse information in response to the count clock signal, and to generate predetermined portions of the fuse information, respectively.

11. The fuse information storage circuit according to claim 10, wherein the unit count latch comprises a plurality of flip-flops which are configured to sequentially shift signal bits of the preliminary fuse information in response to the count clock signal, and to generate a predetermined portion of the fuse information.

12. A fuse information storage circuit of a semiconductor apparatus configured to use one of a plurality of fuse information storage paths to store fuse information to a fuse array block, where at least one of the plurality of fuse information storage paths is configured to store the fuse information if an error occurs when using an other of the plurality of fuse information storage paths,
   where the at least one of the plurality of fuse information storage paths is configured to receive a test mode signal a plurality of times through a dedicated signal path, to store the fuse information.

13. The fuse information storage circuit according to claim 12, wherein:
   the other of the plurality of fuse information storage paths is a first fuse information storage path configured to store information provided through a normal data path of the semiconductor apparatus to the fuse array block as the fuse information; and
   the at least one of the plurality of fuse information storage paths is a second fuse information storage path.

14. The fuse information storage circuit according to claim 13, wherein the second fuse information storage path comprises:
- a test mode decoder configured to decode a test mode signal inputted a plurality of times, and to generate preliminary fuse information; and
- a count latch configured to count the preliminary fuse information in response to a count clock signal, and to generate the fuse information.

15. The fuse information storage circuit according to claim 14, further comprising a mode register which is configured to provide the test mode signal.

16. The fuse information storage circuit according to claim 14, wherein the count latch comprises a plurality of unit count latches which are configured to count each signal bit of the preliminary fuse information in response to the count clock signal, and to generate predetermined portions of the fuse information, respectively.

17. The fuse information storage circuit according to claim 16, wherein the unit count latch comprises a plurality of flip-flops which are configured to sequentially shift signal bits of the preliminary fuse information in response to the count clock signal, and to generate a predetermined portion of the fuse information.

* * * * *